(12) United States Patent
Kitamura et al.

(10) Patent No.: US 6,451,107 B2
(45) Date of Patent: Sep. 17, 2002

(54) METHOD FOR SIMULATING THE SHAPE OF THE SOLID-LIQUID INTERFACE BETWEEN A SINGLE CRYSTAL AND A MOLTEN LIQUID, AND THE DISTRIBUTION OF POINT DEFECTS OF THE SINGLE CRYSTAL

(75) Inventors: Kounosuke Kitamura; Naoki Ono, both of Saitama (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 10 days.

(21) Appl. No.: 09/793,862

(22) Filed: Feb. 26, 2001

(30) Foreign Application Priority Data

Apr. 26, 2000 (JP) ........................................ 2000-125840
Jul. 31, 2000 (JP) ........................................ 2000-230850

(51) Int. Cl.$^7$ ............................................. C30B 13/28
(52) U.S. Cl. ............................ 117/15; 117/13; 117/14; 117/29; 117/202; 117/932
(58) Field of Search .............................. 117/13, 14, 15, 117/932, 29, 202

(56) References Cited

U.S. PATENT DOCUMENTS

| | | | |
|---|---|---|---|
| 5,223,078 A | * 6/1993 | Maeda et al. | 117/15 |
| 5,779,791 A | * 7/1998 | Korb et al. | 117/14 |
| 6,159,282 A | * 12/2000 | Fujiwara | 117/13 |
| 6,171,391 B1 | * 1/2001 | Fuerhoff et al. | 117/14 |
| 6,187,090 B1 | * 2/2001 | Maeda et al. | 117/202 |

OTHER PUBLICATIONS

Rossolenko et al., "Equilibrium shaps of liquid menisci subjected to gravity force and surface tension", Journal of Crystal Growth vol. 104, No. 1 pp. 8–13 Jul. 1990.*
Dupret et al., "Numerical calculation of the global heat trasnfer in a Czochralski furnance", Journal of Crystal Growth, vol. 79 (1–3) pt. 1 pp. 84–91 1986.*

* cited by examiner

Primary Examiner—Robert Kunemund
(74) Attorney, Agent, or Firm—Reed Smith LLP

(57) ABSTRACT

A first step models a hot zone in a pulling apparatus of a single crystal as a mesh structure, and a second step inputs physical property values of each member corresponding to meshes combined for each member of the hot zone into a computer. A third step obtains the surface temperature distribution of each member on the basis of the calorific power of a heater and the emissivity of each member, and a fourth step obtains the internal temperature distribution of each member on the basis of the surface temperature distribution and the thermal conductivity of each member, and then further obtains the internal temperature distribution of a molten liquid being in consideration of convection. A fifth step obtains the shape of the solid-liquid interface between the single crystal and the molten liquid in accordance with an isothermal line including a tri-junction of the single crystal. A sixth step repeats said third to fifth steps until the tri-junction becomes the melting point of the single crystal. The invention aims at making the computation result and an actual measurement result of the shape of the solid-liquid interface between a single crystal and a molten liquid coincide very well with each other.

5 Claims, 7 Drawing Sheets

(a) Example 1

(b) Comparative example 1
(Conventional example)

(c) Comparative example 2

(d) Comparative example 3

(e) Actually measured example

METHOD FOR SIMULATING THE SHAPE OF THE SOLID-LIQUID INTERFACE BETWEEN A SINGLE CRYSTAL AND A MOLTEN LIQUID, AND THE DISTRIBUTION OF POINT DEFECTS OF THE SINGLE CRYSTAL

This application claims Paris Convention priority of Japanese Application Nos. 2000-125840 filed Apr. 26, 2000 and 2000-230850 filed Jul. 31, 2000, the complete disclosure of which is(are) hereby incorporated by reference.

BACKGROUND OF THE INVENTION

1. Field of the Invention

The present invention relates to a method for computer-simulating the shape of the solid-liquid interface between a single crystal and a molten liquid of silicon or the like, said single crystal being pulled by Czochralski (hereinafter referred to as CZ) method, and the distribution of point defects in the single crystal.

2. Description of the Related Art

As a simulation method of this kind, as shown in FIG. 7, there has been known a conventional method which estimates the internal temperature distribution of a silicon molten liquid 2 by operating the thermal conductivity of the molten silicon liquid 2 on the basis of the structure of a hot zone and the pulling speed of a silicon single crystal 4 in a pulling apparatus 1 when pulling the silicon single crystal 4 by means of CZ method using an overall heat transfer simulator and which obtains the shape of the solid-liquid interface between the silicon single crystal 4 and the silicon molten liquid 2 from this internal temperature distribution by means of a computer.

And there has been known another conventional method of obtaining the coordinates and temperature of meshes of a silicon single crystal 4 from the internal temperature distribution of said silicon molten liquid 2 and then solving a diffusion equation on the basis of the diffusion coefficients and the boundary conditions of interstitial silicon atoms and atomic vacancies in the silicon single crystal 4, and thereby obtaining the density distributions of said interstitial silicon atoms and vacancies by means of a computer.

In these methods, each member in the hot zone is mesh-divided and modeled as a mesh structure. Particularly, the silicon molten liquid 2 is divided into comparatively rough meshes of about 10 mm so as to shorten the computation time.

In the above-mentioned conventional methods, however, since the convection of a molten silicon generated in an actual pulling apparatus is not considered and the meshes of the molten silicon are comparatively rough, there has been a problem that a simulation result and an actual measurement result of the shape of a solid-liquid interface are greatly different from each other, and a simulation result (FIG. 6(b)) and an actual measurement result (FIG. 6(e)) of the density distributions of interstitial silicon atoms and vacancies are also greatly different from each other.

SUMMARY OF THE INVENTION

An object of the present invention is to provide a method for simulating the shape of the solid-liquid interface between a single crystal and a molten liquid, in which a computation result and an actual measurement result of the shape of the solid-liquid interface between the single crystal and the molten liquid coincide very well with each other.

Another object of the present invention is to provide a method for simulating the distribution of point defects in a single crystal, in which a computation result and an actual measurement result of the distribution of point defects in the single crystal coincide very well with each other.

A first aspect of the present invention is characterized, as shown in FIGS. 1 and 2, by a method for simulating the shape of the solid-liquid interface between a single crystal and a molten liquid using a computer, comprising;

a first step of modeling as a mesh structure a hot zone in a pulling apparatus 11 of the single crystal 14 to be computed, a second step of combining meshes for each member in the hot zone and inputting physical property values of each member corresponding to the combined meshes into the computer, a third step of obtaining the surface temperature distribution of each member on the basis of the calorific power of a heater and the emissivity of each member, a fourth step of obtaining the internal temperature distribution of each member by solving a heat conduction equation on the basis of the surface temperature distribution and the thermal conductivity of each member, and then further obtaining the internal temperature distribution of a molten liquid 12 being in consideration of convection by simultaneously solving a turbulent model equation obtained on the assumption that the molten liquid 12 is a turbulent flow and Navier-Stokes equation, a fifth step of obtaining the shape of the solid-liquid interface between the single crystal 14 and the molten liquid 12 in accordance with an isothermal line including a tri-junction S of the single crystal 14, and a sixth step of repeating the third to fifth steps until the tri-junction S becomes the melting point of the single crystal 14, wherein;

some or all of the meshes of the molten liquid 12 which are in the radial directions of the single crystal 14 and are directly under the single crystal 14 are set at 0.01 to 5.00 mm, and some or all of the meshes of the molten liquid 12 which are in the longitudinal direction of the single crystal 14 are set to 0.01 to 5.00 mm.

Since the method for simulating the solid-liquid interface between a single crystal and a molten liquid according to the first aspect of the present invention takes account of convection of the molten liquid 12 and sets comparatively fine meshes of the molten liquid 12, the shape of the solid-liquid interface between the single crystal 14 and the molten liquid 12 obtained by computation coincides very well with an actual measurement result.

It is preferable that the physical property values to be given to each member in the second step are the thermal conductivity, emissivity, viscosity, coefficient of thermal expansion, density and specific heat of each member.

Further, it is preferable that the turbulent model equation is a kl-model equation represented by equation (1), and an optional value within a range of 0.4 to 0.6 is used as a turbulent parameter C of this model equation:

$$\kappa_t = \frac{c}{Pr_t} \times \rho \times C \times d\sqrt{k} \qquad (1)$$

Here, $\kappa_t$ is the turbulent thermal conductivity of a molten liquid, c is the specific heat of the molten liquid, $Pr_t$ is Prandtl number, $\rho$ is the density of the molten liquid, d is a distance from the inner wall of a crucible containing the molten liquid, and k is the sum square of variable components to the average flow speed of the molten liquid.

As shown in FIGS. 2 to 4, a second aspect of the present invention is a method for simulating the distribution of point defects of a single crystal using a computer, comprising;

a first step of modeling as a mesh structure a hot zone in a pulling apparatus 11 of a single crystal 14 in a state in which the single crystal 14 has been pulled to a specified length by the pulling apparatus 11, a second step of combining meshes for each member in the hot zone, and inputting the physical property values of each member corresponding to the combined meshes, the pulled length of the single crystal 14 and the pulling speed of the single crystal 14 corresponding to the pulled length into the computer, a third step of obtaining the surface temperature distribution of each member on the basis of the calorific power of a heater and the emissivity of each member, a fourth step of obtaining the internal temperature distribution of each member by solving a heat conduction equation on the basis of the surface temperature distribution and the thermal conductivity of each member, and then further obtaining the internal temperature distribution of a molten liquid 12 being in consideration of convection by simultaneously solving a turbulent model equation obtained on the assumption that the molten liquid 12 is a turbulent flow and Navier-Stokes equation, a fifth step of obtaining the shape of the solid-liquid interface between the single crystal 14 and the molten liquid 12 in accordance with an isothermal line including a tri-junction S of the single crystal 14, a sixth step of repeating the third to fifth steps until the tri-junction S becomes the melting point of the single crystal 14, computing the temperature distribution inside the pulling apparatus, obtaining the coordinates and temperatures of the meshes of the single crystal 14, and inputting the respective data into the computer, a seventh step of repeating the first to sixth steps as varying by stages the pulled length of the single crystal 14, computing the temperature distribution in the pulling apparatus 11, obtaining the coordinates and temperatures of the meshes of the single crystal 14, and inputting the respective data into the computer, an eighth step of inputting the coordinates and temperature data of the meshes of the single crystal 14, and the diffusion coefficients and the boundary conditions of vacancies and interstitial atoms in the single crystal 14 into the computer, and a ninth step of solving a diffusion equation on the basis of the coordinates and temperatures of the meshes of the single crystal 14 and the diffusion coefficients and boundary conditions of the vacancies and interstitial atoms, and thereby obtaining the density distributions of the vacancies and interstitial atoms after the single crystal 14 has been cooled.

In the method for simulating the distribution of point defects of a single crystal according to the second aspect of the present invention, since the internal temperature distribution of the single crystal 14 is obtained in consideration of convection of the molten liquid 12 and the distribution of point defects in the single crystal 14 is obtained on the basis of this internal temperature distribution of the single crystal 14 and in consideration of the diffusion of point defects in the single crystal 14, the computation values and actual measurement values of the distribution of point defects in the single crystal 14 coincide very well with each other.

DETAILED DESCRIPTION OF EMBODIMENTS OF THE INVENTION

Next, a first embodiment of the present invention is described with reference to the drawings.

Figure 2:
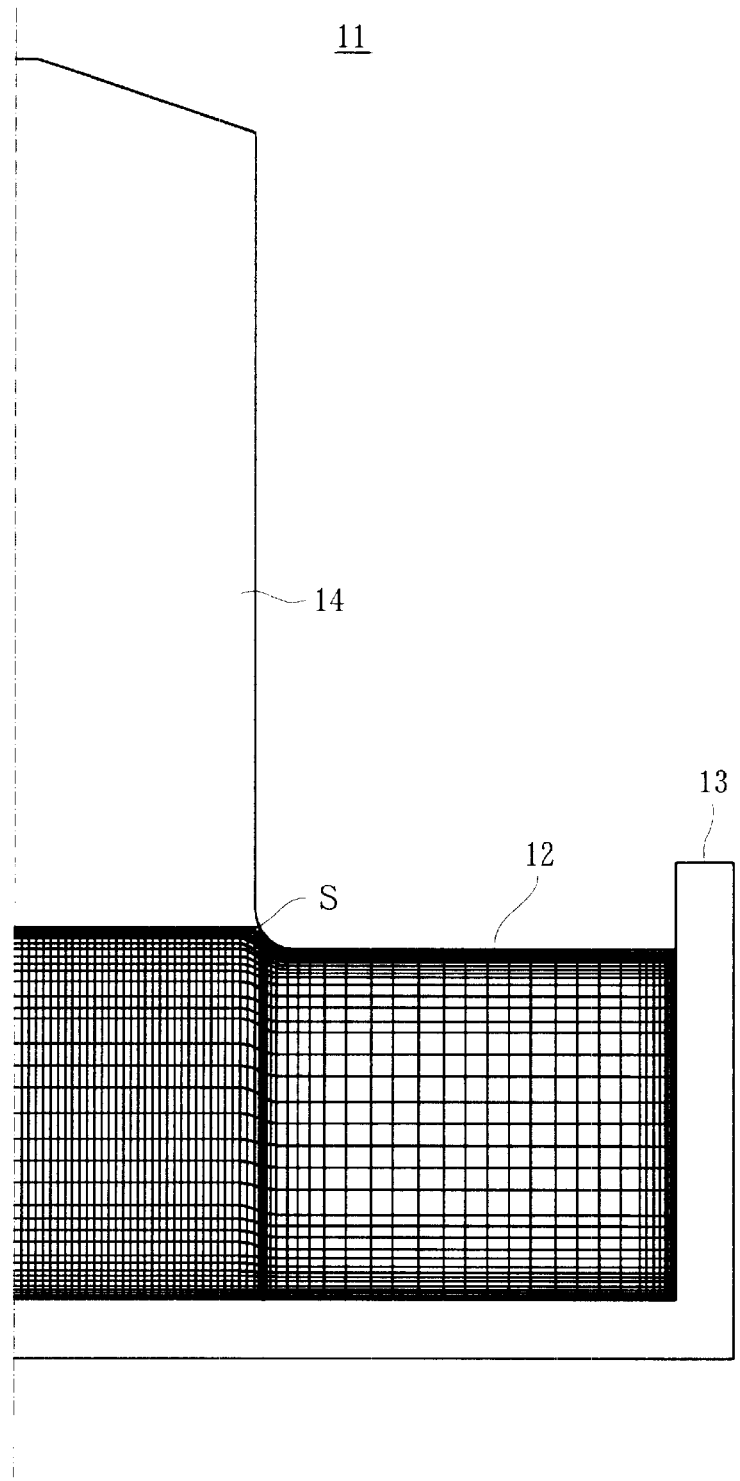
FIG. 2 is a sectional view of the main part of a pulling apparatus of a silicon single crystal having a silicon molten liquid modeled as a mesh structure according to a first and a second embodiment of the present invention.

As shown in FIG. 2, a chamber of a silicon single crystal pulling apparatus 11 is provided with a quartz crucible 13 to contain a silicon molten liquid 12. This crucible 13 is connected to a crucible driving means through a graphite susceptor and a supporting shaft (not illustrated), and the crucible driving means is composed so as to turn and raise and lower the quartz crucible 13. And the outer face of the quartz crucible 13 is surrounded by a heater (not illustrated) with a fixed spacing from the quartz crucible 13, and this heater is surrounded by a heat insulation cylinder (not illustrated). The heater heats and melts a high-purity polycrystalline silicon put in the quartz crucible 13 to make a silicon molten liquid 12. And a cylindrical casing not illustrated is connected to the top of the chamber, and this casing is provided with a pulling means. The pulling means is composed so as to pull a silicon single crystal as turning it.

A method for simulating the shape of the solid-liquid interface between the silicon single crystal 14 and the silicon molten liquid 12 in the silicon single crystal pulling apparatus 11 composed in such a way is described with reference to FIGS. 1 and 2.

First, a first step divides each member in the hot zone of the silicon single crystal pulling apparatus 11 into meshes and models each member as a mesh structure, said each member being the chamber, quartz crucible 13, silicon molten liquid 12, silicon single crystal 14, graphite susceptor, heat insulation cylinder and the like. Concretely, the coordinates data of mesh points of each member in said hot zone are inputted into a computer. At this time, some or all of the meshes of the silicon molten liquid 12 which are in the radial directions of the silicon single crystal 14 and directly under the silicon single crystal 14 (hereinafter, referred to as radial meshes) are set at 0.01 to 5.00 mm, preferably, 0.25 to 1.00 mm. And some or all of the meshes of the silicon molten liquid 12 which are in the longitudinal direction of the silicon single crystal 14 and directly under the silicon single crystal 14 (hereinafter, referred to as longitudinal meshes) are set at 0.01 to 5.00 mm, preferably, 0.1 to 0.5 mm.

The reason why the radial meshes are limited within a range of 0.01 to 5.00 mm is that a range less than 0.01 mm requires a very long computing time, while a range exceeding 5.00 mm makes the computation unstable and cannot definitely determine the shape of a solid-liquid interface even if repeating the computation. And the reason why the longitudinal meshes are limited within a range of 0.01 to 5.00 mm is that a range less than 0.01 mm requires a very long computing time, while a range exceeding 5.00 mm makes the computation values of the shape of a solid-liquid interface not coincide with actual measurement values. In case of limiting some of the radial meshes within a range of 0.01 to 5.00 mm, it is preferable that the silicon molten liquid 12 being close to the outer edge of the silicon single crystal 14 and directly under the silicon single crystal 14 is limited within said range, and in case of limiting some of the longitudinal meshes within a range of 0.01 to 5.00 mm, it is preferable that the silicon molten liquid 12 being close to the surface and the bottom of the silicon molten liquid 12 is limited within said range.

Next, a second step combines meshes for each member in said hot zone and inputs physical property values of each member for the combined meshes into a computer. For example, when the chamber is formed out of stainless steel, the thermal conductivity, emissivity, viscosity, coefficient of thermal expansion, density and specific heat of the stainless steel are inputted into the computer. And a turbulent parameter C of a turbulent model equation (1) described later is inputted into the computer.

A third step obtains the surface temperature distribution of each member in the hot zone on the basis of the calorific power of the heater and the emissivity of each member, using the computer. Namely, an optionally set calorific power of the heater is inputted into the computer and the surface temperature distribution of each member is obtained from the emissivity of each member by means of the computer. Next, a fourth step obtains the internal temperature distribution of each member by solving a heat conduction equation (2) on the basis of the surface temperature distribution and the thermal conductivity of each member in the hot zone. Although a system of xyz rectangular coordinates is used here for simplification of the description, a system of cylindrical coordinates is used in an actual computation.

$$\rho c \frac{\partial T}{\partial t} = \frac{\partial}{\partial t}\left(\lambda_x \frac{\partial T}{\partial x}\right) + \frac{\partial}{\partial y}\left(\lambda_y \frac{\partial T}{\partial y}\right) + \frac{\partial}{\partial z}\left(\lambda_z \frac{\partial T}{\partial z}\right) + q \quad (2)$$

Here, $\rho$ is the density of each member, c is the specific heat of each member, T is the absolute temperature at each mesh point of each member, t is time, $\lambda_x$, $\lambda_y$ and $\lambda_z$ are the x, y and z components of the thermal conductivity of each member, and q is the calorific power of the heater.

On the other hand, as for the silicon molten liquid 12, the internal temperature distribution of the molten liquid 12 obtained by said heat conduction equation (2), and then on the basis of this internal temperature distribution of the molten liquid 12, the internal flow speed distribution of the silicon molten liquid 12 is obtained by simultaneously solving a turbulent model equation (1) obtained on the assumption that the silicon molten liquid 12 is a turbulent flow and Navier-Stokes equations (3) to (5) using the computer.

$$\kappa_t = \frac{c}{Pr_t} \times \rho \times C \times d\sqrt{k} \quad (1)$$

Here, $\kappa_t$ is the turbulent thermal conductivity of the silicon molten liquid 12, c is the specific heat of the silicon molten liquid 12, $Pr_t$ is Prandtl number, $\rho$ is the density of the silicon molten liquid 12, C is a turbulent parameter, d is a distance from the inner wall of a crucible containing the silicon molten liquid 12, and k is the sum square of variable components to the average flow speed of the silicon molten liquid 12.

$$\frac{\partial u}{\partial t} + u\frac{\partial u}{\partial x} + v\frac{\partial u}{\partial y} + w\frac{\partial u}{\partial z} = \quad (3)$$
$$-\frac{1}{\rho}\frac{\partial p}{\partial x} + (v_1 + v_t)\left(\frac{\partial^2 u}{\partial x^2} + \frac{\partial^2 u}{\partial y^2} + \frac{\partial^2 u}{\partial z^2}\right) + \frac{F_x}{\rho}$$

$$\frac{\partial v}{\partial t} + u\frac{\partial v}{\partial x} + v\frac{\partial v}{\partial y} + w\frac{\partial v}{\partial z} = \quad (4)$$
$$-\frac{1}{\rho}\frac{\partial p}{\partial y} + (v_1 + v_t)\left(\frac{\partial^2 v}{\partial x^2} + \frac{\partial^2 v}{\partial y^2} + \frac{\partial^2 v}{\partial z^2}\right) + \frac{F_y}{\rho}$$

$$\frac{\partial w}{\partial t} + u\frac{\partial w}{\partial x} + v\frac{\partial w}{\partial y} + w\frac{\partial w}{\partial z} = \quad (5)$$
$$-\frac{1}{\rho}\frac{\partial p}{\partial z} + (v_1 + v_t)\left(\frac{\partial^2 w}{\partial x^2} + \frac{\partial^2 w}{\partial y^2} + \frac{\partial^2 w}{\partial z^2}\right) + \frac{F_z}{\rho}$$

Here, u, v and w are respectively the x, y and z components of the flow speed at each mesh point of the silicon molten liquid 12, $v_1$ is the molecular kinematic viscosity (physical property value) of the silicon molten liquid 12, $v_t$ is the coefficient of kinematic viscosity provided by a turbulent effect of the silicon molten liquid 12 and $F_x$, $F_y$ and $F_z$ are respectively the x, y and z components of a body force acting on the silicon molten liquid 12.

Said turbulent model equation (1) is called a kl-model equation, and as the turbulent parameter C of this model equation, it is preferable that an optional value within a range of 0.4 to 0.6 is used. The reason why the turbulent parameter C is limited within a range of 0.4 to 0.6 is that there is a disadvantage that a range being less than 0.4 or more than 0.6 makes the interface shape obtained by computation not coincide with an actual measurement result. And said Navier-Stokes equations (3) to (5) are the equations of motion on the assumption that the silicon molten liquid 12 is a fluid being non-compressible and constant in viscosity.

The internal temperature distribution of the silicon molten liquid 12 being in consideration of convection is further obtained by solving by means of the computer a heat energy equation (6) on the basis of the internal flow speed of the silicon molten liquid 12 obtained above.

$$u\frac{\partial T}{\partial x} + v\frac{\partial T}{\partial y} + w\frac{\partial T}{\partial z} = \frac{1}{\rho c}(\kappa_1 + \kappa_t)\left(\frac{\partial^2 T}{\partial x^2} + \frac{\partial^2 T}{\partial y^2} + \frac{\partial^2 T}{\partial z^2}\right) \quad (6)$$

Here, u, v and w are respectively the x, y and z components of the flow speed at each mesh point of the silicon molten liquid 12, T is the absolute temperature at each mesh point of the silicon molten liquid 12, ρ is the density of the silicon molten liquid 12, c is the specific heat of the silicon molten liquid 12, $\kappa_1$ is the molecular thermal conductivity (physical property value) and $\kappa_t$ is a turbulent thermal conductivity computed using equation (1).

Next, a fifth step obtains by means of the computer the shape of the solid-liquid interface between the silicon single crystal 14 and the silicon molten liquid 12 in accordance with an isothermal line including a tri-junction S (tri-junction of solid, liquid and gas) of the silicon shown by point S of FIG. 2. Further, varying (gradually increasing) the calorific power of the heater to be inputted into the computer, this method repeats said third to fifth steps until the tri-junction becomes the melting point of the single crystal 14.

The shape of the solid-liquid interface between the silicon single crystal 14 and the silicon molten liquid 12 obtained in such a way coincides almost with an actual measurement result. As the result, the shape of a solid-liquid interface obtained by the present invention can be used as the basis of computation to estimate the distribution of point defects inside a crystal being in consideration of diffusion of the point defects when pulling the silicon single crystal 14.

Figure 3:
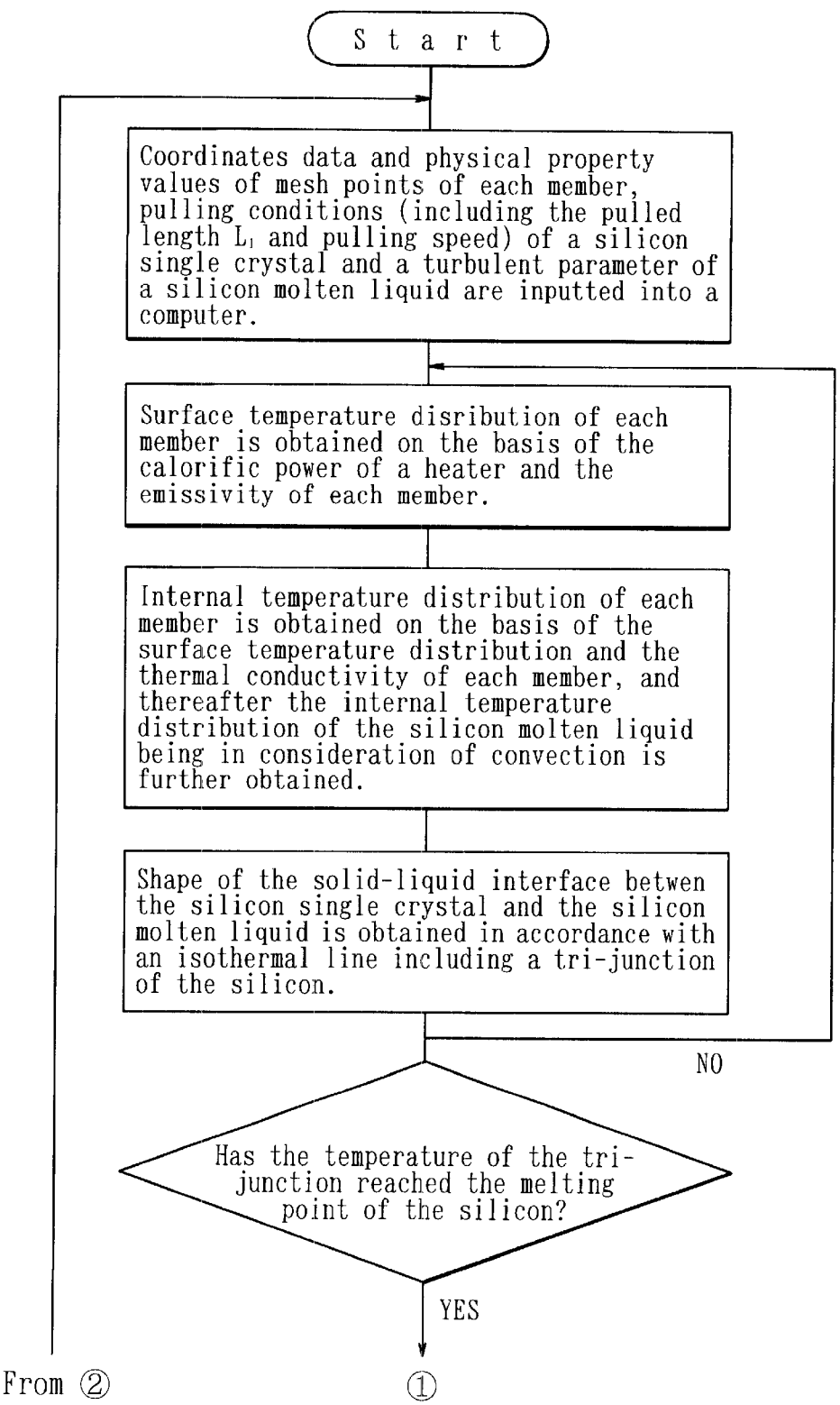
FIG. 3 is a flowchart showing the first half of a method for simulating the shape of the solid-liquid interface between a silicon single crystal and a silicon molten liquid according to a second embodiment of the present invention.
Figure 4:
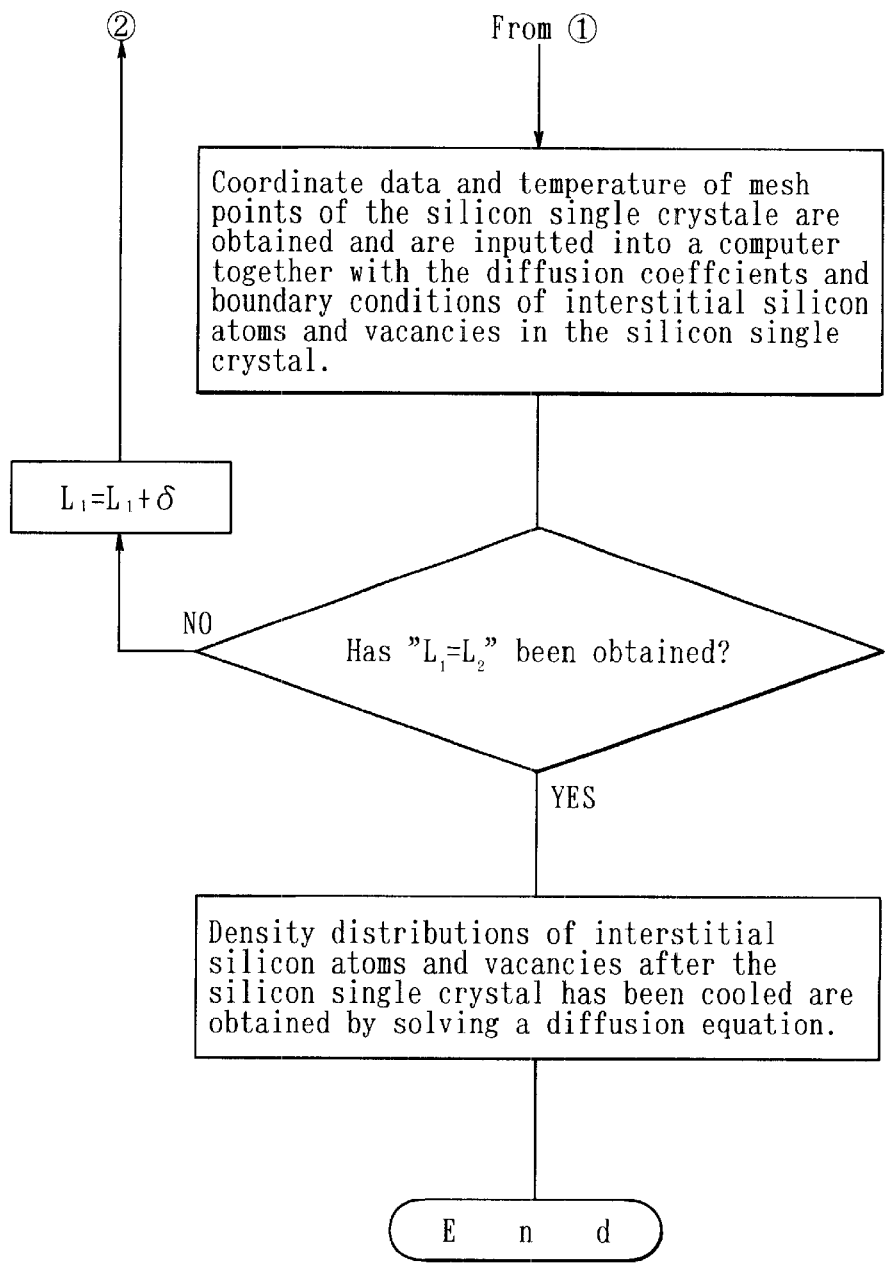
FIG. 4 is a flowchart showing the second half of a method for simulating the shape of the solid-liquid interface between a silicon single crystal and a silicon molten liquid according to a second embodiment of the present invention.

FIGS. 2 to 4 show a second embodiment of the present invention.

In this embodiment, the silicon single crystal pulling apparatus 11 shown in FIG. 2 is used in the same manner as said first embodiment.

A method for simulating the distribution of point defects in a silicon single crystal 14 in this silicon single crystal pulling apparatus 11 is described with reference to FIGS. 2 to 4.

First, a first step divides each member in a hot zone of the silicon single crystal pulling apparatus 11 in a state in which the silicon single crystal 14 has been pulled to a specified length $L_1$ (100 mm for example) into meshes and models each member as a mesh structure, said each member being a chamber, quartz crucible 13, silicon molten liquid 12, silicon single crystal 14, graphite susceptor, heat insulation cylinder and the like. Concretely, in the same way as the first embodiment, the coordinates data of the mesh points of each member in said hot zone are inputted into a computer. At this time, the radial meshes and the longitudinal meshes of the silicon molten liquid 12 are respectively set in the same way as the first embodiment.

A second step combines meshes for each member in said hot zone and inputs physical property values of each member for the combined meshes into a computer. For example, when the chamber is formed out of stainless steel, the thermal conductivity, emissivity, viscosity, coefficient of thermal expansion, density and specific heat of the stainless steel are inputted into the computer. And the pulled length of the silicon single crystal 14, a pulling speed of the silicon single crystal 14 corresponding to this pulled length and the turbulent parameter C of the turbulent model equation (1) described in the first embodiment are inputted into the computer.

In the same way as the third step of the first embodiment, a third step obtains by means of the computer the surface temperature distribution of each member in the hot zone on the basis of the calorific power of the heater and the emissivity of each member, and in the same way as the fourth step of the first embodiment, a fourth step obtains the internal temperature distribution of each member by solving by means of the computer a heat conduction equation (2) on the basis of the surface temperature distribution and the thermal conductivity of each member in the hot zone.

$$\rho c \frac{\partial T}{\partial t} = \frac{\partial}{\partial t}\left(\lambda_x \frac{\partial T}{\partial x}\right) + \frac{\partial}{\partial y}\left(\lambda_y \frac{\partial T}{\partial y}\right) + \frac{\partial}{\partial z}\left(\lambda_z \frac{\partial T}{\partial z}\right) + q \quad (2)$$

On the other hand, as for the silicon molten liquid 12, in the same way as the first embodiment, the internal temperature distribution of the molten liquid 12 is obtained by said heat conduction equation (2), and then on the basis of this internal temperature distribution of the molten liquid 12, the internal flow speed distribution of the silicon molten liquid 12 is obtained by simultaneously solving a turbulent model equation (1) obtained on the assumption that the silicon molten liquid 12 is a turbulent flow and Navier-Stokes equations (3) to (5) by means of the computer.

$$\kappa_t = \frac{c}{Pr_t} \times \rho \times C \times d\sqrt{k} \quad (1)$$

$$\frac{\partial u}{\partial t} + u\frac{\partial u}{\partial x} + v\frac{\partial u}{\partial y} + w\frac{\partial u}{\partial z} = \quad (3)$$
$$-\frac{1}{\rho}\frac{\partial p}{\partial x} + (\nu_1 + \nu_t)\left(\frac{\partial^2 u}{\partial x^2} + \frac{\partial^2 u}{\partial y^2} + \frac{\partial^2 u}{\partial z^2}\right) + \frac{F_x}{\rho}$$

$$\frac{\partial v}{\partial t} + u\frac{\partial v}{\partial x} + v\frac{\partial v}{\partial y} + w\frac{\partial v}{\partial z} = \quad (4)$$
$$-\frac{1}{\rho}\frac{\partial p}{\partial y} + (\nu_1 + \nu_t)\left(\frac{\partial^2 v}{\partial x^2} + \frac{\partial^2 v}{\partial y^2} + \frac{\partial^2 v}{\partial z^2}\right) + \frac{F_y}{\rho}$$

$$\frac{\partial w}{\partial t} + u\frac{\partial w}{\partial x} + v\frac{\partial w}{\partial y} + w\frac{\partial w}{\partial z} = \quad (5)$$
$$-\frac{1}{\rho}\frac{\partial p}{\partial z} + (\nu_1 + \nu_t)\left(\frac{\partial^2 w}{\partial x^2} + \frac{\partial^2 w}{\partial y^2} + \frac{\partial^2 w}{\partial z^2}\right) + \frac{F_z}{\rho}$$

The internal temperature distribution of the silicon molten liquid 12 being in consideration of convection of the silicon molten liquid 12 is further obtained by solving by means of the computer a heat energy equation (6) on the basis of the internal flow speed distribution of the silicon molten liquid 12 obtained above.

$$u\frac{\partial T}{\partial x} + v\frac{\partial T}{\partial y} + w\frac{\partial T}{\partial z} = \frac{1}{\rho c}(\kappa_1 + \kappa_t)\left(\frac{\partial^2 T}{\partial x^2} + \frac{\partial^2 T}{\partial y^2} + \frac{\partial^2 T}{\partial z^2}\right) \quad (6)$$

Next, in the same way as the fifth step of the first embodiment, a fifth step obtains by means of the computer the shape of the solid-liquid interface between the single crystal 14 and the silicon molten liquid 12 in accordance with an isothermal line including a tri-junction S (tri-junction of solid, liquid and gas) of the silicon shown by point S of FIG. 2. A sixth step varies the calorific power of the heater to be inputted into the computer, namely, gradually increases the calorific power of the heater; and repeats said third to fifth steps until the tri-junction becomes the melting point of the silicon single crystal 14, and then computes the temperature distribution inside the pulling apparatus 11, obtains the coordinates and temperatures of the meshes of the silicon single crystal 14, and makes the computer memorize these data.

Next, a seventh step adds δ (50 mm for example) to the pulled length $L_1$ of the silicon single crystal 14, repeats said first to sixth steps, and then computes the temperature distribution inside the pulling apparatus 11, obtains the coordinates and temperatures of the meshes of the silicon single crystal 14, and makes the computer memorize these data. This seventh step is performed until the pulled length $L_1$ of the silicon single crystal 14 reaches a length $L_2$ ($L_2$>$L_1$). When the pulled length $L_1$ of the silicon single crystal 14 reaches the length $L_2$, the method proceeds to an eighth step, which inputs the coordinates and temperature data of the meshes of the single crystal 14, and the diffusion coefficients and the boundary conditions of vacancies and interstitial silicon atoms in the silicon single crystal 14 into the computer. Further, this method solves a diffusion equation on the basis of these diffusion coefficients and boundary conditions of vacancies and interstitial silicon atoms, and thereby obtains the density distributions of vacancies and interstitial silicon atoms after the single crystal 14 has been cooled.

Concretely, a computing expression of the density $C_i$ of interstitial silicon atoms is represented by the following equation (7) and a computing expression of the density $C_v$ of vacancies is represented by the following equation (8). In equations (7) and (8), in order to compute a state in which the densities $C_i$ and $C_v$ vary with time, it is assumed that a thermal equilibrium between the interstitial silicon atoms and the vacancies is kept in the side faces and the top face of the crystal and in the solid-liquid interface.

$$C_i^e = K_1 \exp\left(-\frac{E_i}{kT}\right) \quad (7)$$

$$C_v^e = K_2 \exp\left(-\frac{E_v}{kT}\right) \quad (8)$$

Here, $K_1$ and $K_2$ are constants, $E_i$ and $E_v$ are respectively formation energies of interstitial silicon atoms and vacancies, a superior letter e is an equilibrium quantity, k is Boltzmann constant, and T is an absolute temperature.

Said equilibrium equations are differentiated by time to become respectively the following equations (9) and (10) with respect to interstitial silicon atoms and vacancies.

$$\frac{dC_i}{dt} = -\nabla(D_i \nabla C_i) + \nabla\left(\frac{E_t^i}{kT^2} D_i C_i \nabla T\right) + k_{iv}(T)[C_i C_v - C_e^i(T) C_e^v(T)] \quad (9)$$

$$\frac{dC_v}{dt} = -\nabla(D_v \nabla C_v) + \nabla\left(\frac{E_t^v}{kT^2} D_v C_v \nabla T\right) + k_{iv}(T)[C_i C_v - C_e^i(T) C_e^v(T)] \quad (10)$$

The first terms $D_i$ and $D_v$ of the respective right sides of equations (9) and (10) represent respectively Fickian diffusions having the diffusion coefficients as shown in equations (11) and (12).

$$D_i = d_i \exp\left(-\frac{\Delta E_i}{kT}\right) \quad (11)$$

$$D_v = d_v \exp\left(-\frac{\Delta E_v}{kT}\right) \quad (12)$$

Here, $\Delta E_i$ and $\Delta E_v$ are respectively activation energies of interstitial silicon atoms and vacancies, and $d_i$ and $d_v$ are respectively constants. And $E_t^i$ and $E_t^v$ of the second terms of the respective right sides of equations (9) and (10) are activation energies of interstitial silicon atoms and vacancies provided by thermal diffusion, and each $k_{iv}$ of the third terms of the respective right sides of equations (9) and (10) is respectively recombination constant of a pair of interstitial silicon atom and vacancy.

The distribution of point defects of a silicon single crystal 14 obtained in such a way coincides almost with an actual measurement result. As the result, it is possible to estimate the distribution of point defects in a silicon single crystal 14 pulled by a pulling apparatus 11 at the stage of designing the pulling apparatus 11, and inversely, it is possible to examine the structure of a pulling apparatus 11 at the stage of designing it in order to obtain a desired distribution of point defects in a silicon single crystal 14 pulled.

In said first and second embodiments, a silicon single crystal has been used, but a GaAs single crystal, an InP single crystal, a ZnS single crystal or a ZnSe single crystal also may be used.

Embodiments

Next, embodiments of the present invention and comparative examples are described in detail.

Embodiment 1

Figure 1:
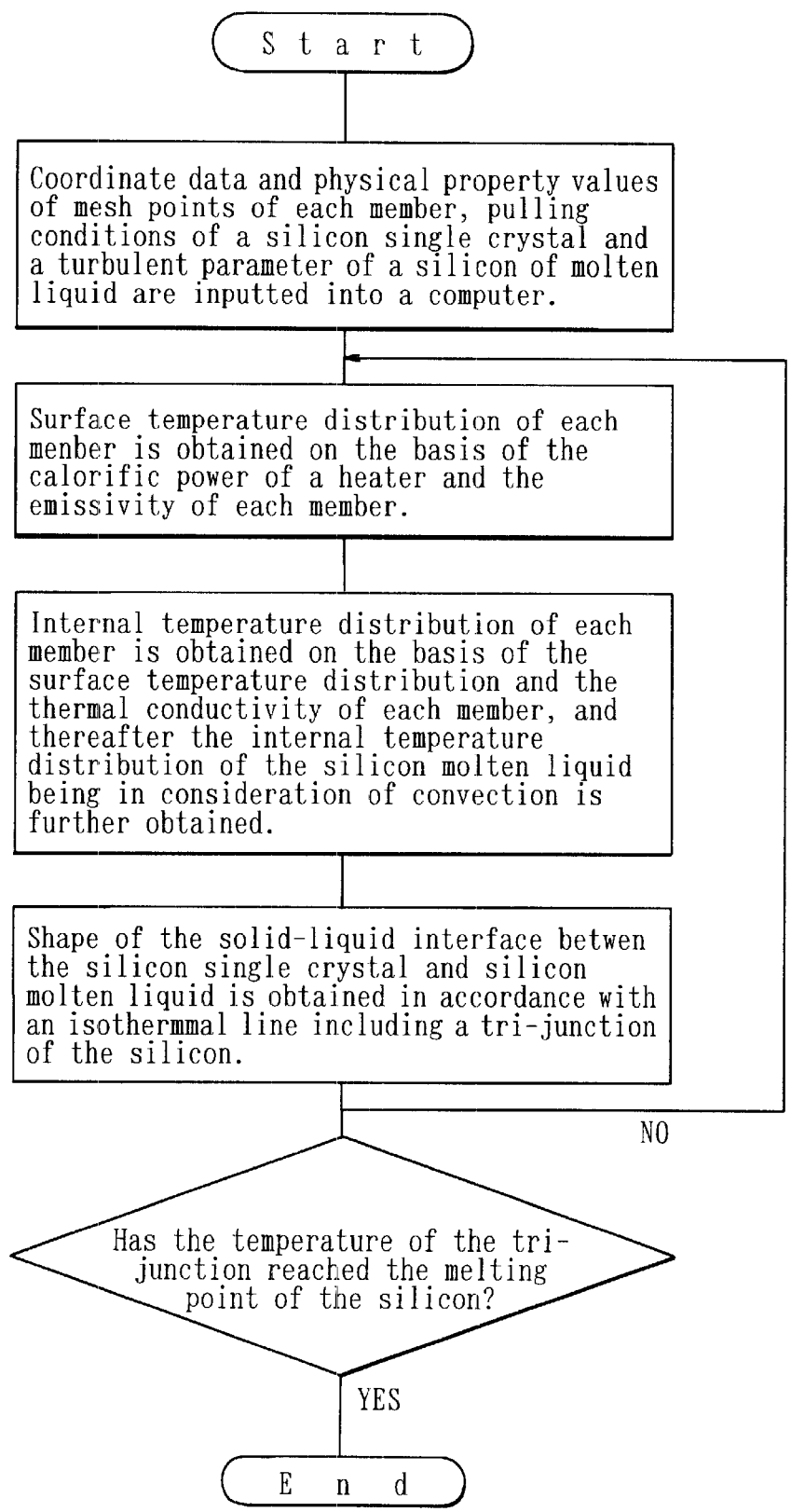
FIG. 1 is a flowchart showing a method for simulating the shape of the solid-liquid interface between a silicon single crystal and a silicon molten liquid according to a first embodiment of the present invention.

As shown in FIG. 2, the shape of the solid-liquid interface between a silicon single crystal 14 and a silicon molten liquid 12 in case of pulling the silicon single crystal 14 of 6 inches in diameter from the silicon molten liquid 12 stored in a quartz crucible 13 was obtained by a simulation method on the basis of a flowchart of FIG. 1. Namely, the hot zone in a silicon single crystal pulling apparatus 11 was modeled as a mesh structure. Hereupon, meshes of the silicon molten liquid 12 being in the radial directions of the silicon single crystal 14 and being directly under the silicon single crystal 14 were set at 0.75 mm, and meshes of the silicon molten liquid 12 being in the radial directions of the silicon single crystal 14 and being not directly under the silicon single crystal 14 were set at 1 to 5 mm. And meshes in the longitudinal direction of the silicon single crystal 14 of the silicon molten liquid 12 were set at 0.25 to 5 mm. Further, as the turbulent parameter C of a turbulent model equation, 0.45 was used.

Comparative Example 1

Figure 7:
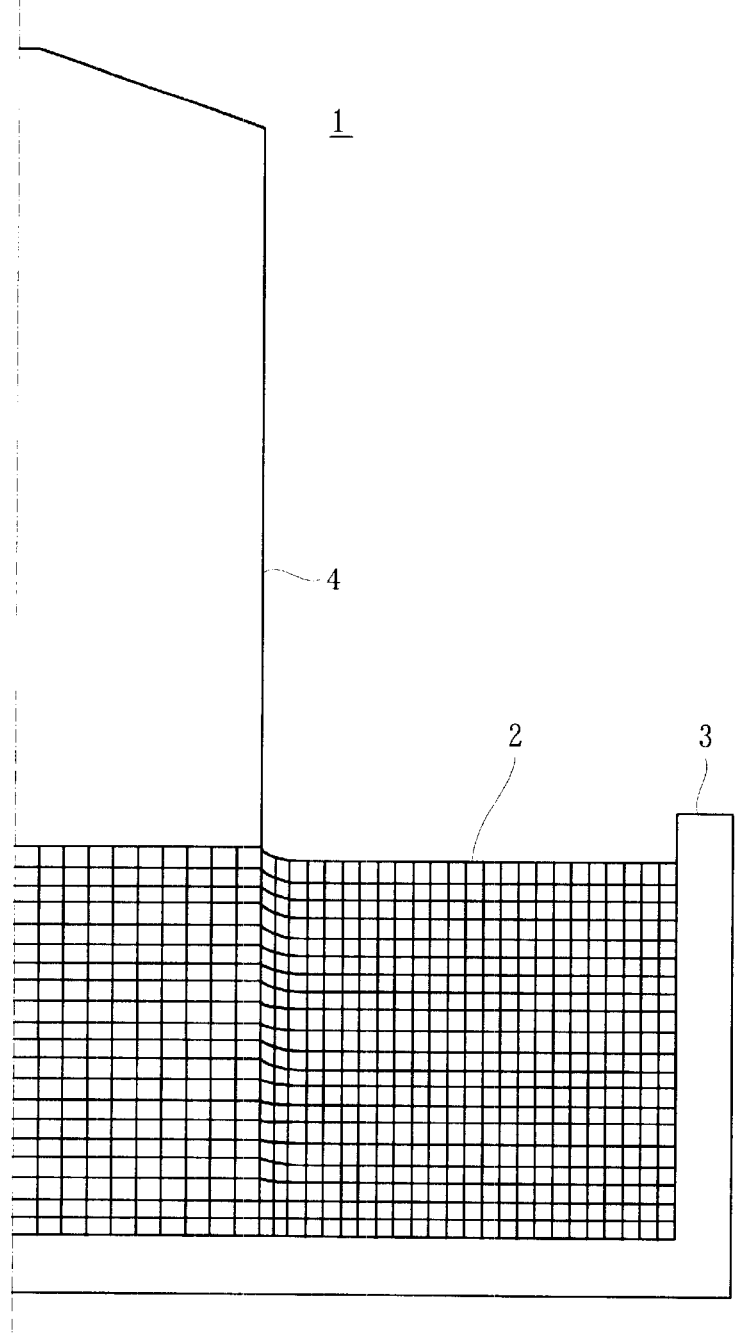
FIG. 7 is a sectional view of the main part of a pulling apparatus of a silicon single crystal having a silicon molten liquid modeled as a mesh structure according to a conventional example and comparative examples 1 and 2.

As shown in FIG. 7, the shape of the solid-liquid interface between a silicon single crystal 4 and a silicon molten liquid 2 in case of pulling the silicon single crystal 4 of 6 inches in diameter from the silicon molten liquid 2 stored in a quartz crucible 3 was obtained by a conventional simulation method. Namely, the hot zone in a silicon single crystal pulling apparatus 1 was modeled as a mesh structure. Hereupon, meshes of the silicon molten liquid 2 in the radial directions of the silicon single crystal 4 were set at 10 mm, and meshes of the silicon molten liquid 2 in the longitudinal direction of the silicon single crystal 4 were set at 10 mm. And no convection of the silicon molten liquid 2 was considered (simultaneous equations of a turbulent model equation and Navier-Stokes equation were not used). Simulation was performed using a computer in the same way as embodiment 1 except the above-mentioned conditions.

<Comparison Test 1 and Evaluation>

The shape of the solid-liquid interface between a silicon single crystal and a silicon molten liquid was obtained by a simulation method of each of embodiment 1 and comparative example 1. The result is shown in FIG. 5.

Figure 5:
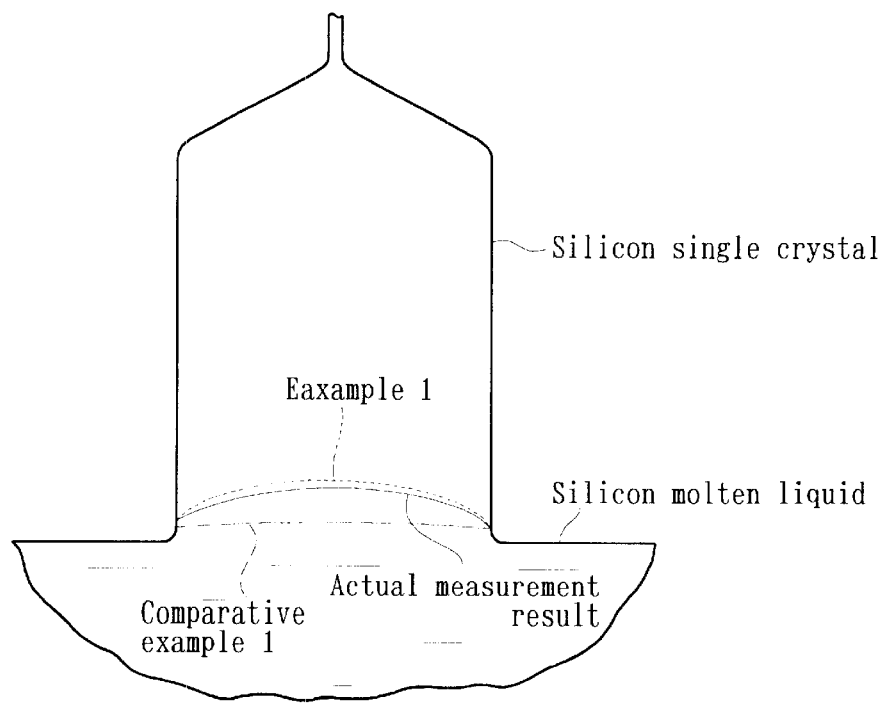
FIG. 5 is a front view of the main part showing the shape of the solid-liquid interface between a silicon single crystal and a silicon molten liquid according to each of embodiment 1, comparative example 1 and an actual measurement result.

As apparently seen from FIG. 5, it was found that while the shape of a solid-liquid interface obtained by the simulation method of comparative example 1 (represented by a chain line) was greatly different from an actual measurement result (represented by a solid line), the shape of a solid-liquid interface obtained by the simulation method of embodiment 1 (represented by a dashed line) was almost coincident with the actual measurement result.

Embodiment 2

As shown in FIG. 2, the distribution of point defects in a silicon single crystal 14 in case of pulling the silicon single crystal 14 of 6 inches in diameter from the silicon molten liquid 12 stored in a quartz crucible 13 was obtained by a simulation method on the basis of a flowchart of FIGS. 3 and 4.

Namely, the hot zone in a silicon single crystal pulling apparatus 11 was modeled as a mesh structure. Hereupon, meshes of the silicon molten liquid 12 being in the radial directions of the silicon single crystal 14 and being directly under the silicon single crystal 14 were set at 0.75 mm, and meshes of the silicon molten liquid 12 being in the radial directions of the silicon single crystal 14 and being not directly under the silicon single crystal 14 were set at 1 to 5 mm. And meshes of the silicon molten liquid 12 in the longitudinal direction of the silicon single crystal 14 were set at 0.25 to 5 mm, and as the turbulent parameter C of a turbulent model equation, 0.45 was used. Under this condition, the internal temperature distribution of the silicon single crystal 14 was obtained in consideration of convection of the silicon molten liquid 12, and the distribution of point defects in the silicon single crystal 14 was obtained on the basis of this internal temperature distribution of the silicon single crystal 14 and in consideration of diffusion of point defects in the silicon single crystal 14.

Comparative Example 2

As shown in FIG. 7, the distribution of point defects in a silicon single crystal 4 in case of pulling the silicon single crystal 4 of 6 inches in diameter from the silicon molten liquid 2 stored in a quartz crucible 3 was obtained by a conventional simulation method. Namely, the hot zone in a silicon single crystal pulling apparatus 1 was modeled as a mesh structure. Hereupon, meshes of the silicon molten liquid 2 in the radial directions of the silicon single crystal 4 were set at 10 mm, and meshes of the silicon molten liquid 2 in the longitudinal direction of the silicon single crystal 4 were set at 10 mm. And no convection of the silicon molten liquid 2 was considered (simultaneous equations of a turbulent model equation and Navier-Stokes equation were not used). Simulation was performed using a computer in the same way as embodiment 1 except the above-mentioned conditions.

Comparative Example 3

Simulation was performed using a computer in the same way as embodiment 1 except that convection of a silicon molten liquid was considered but no diffusion of point defects in a silicon single crystal was considered.

Comparative Example 4

Simulation was performed using a computer in the same way as embodiment 1 except that no convection of a silicon molten liquid nor diffusion of point defects in a silicon single crystal was considered.

<Comparison Test 2 and Evaluation>

The distribution of point defects in a silicon single crystal was obtained by a simulation method of each of embodiment 2 and comparative examples 2 to 4. The result of simulation is shown in FIGS. 6(a) to 6(d) together with an actual measurement result of the distribution of point defects in a silicon single crystal in FIG. 6(e).

Figure 6:
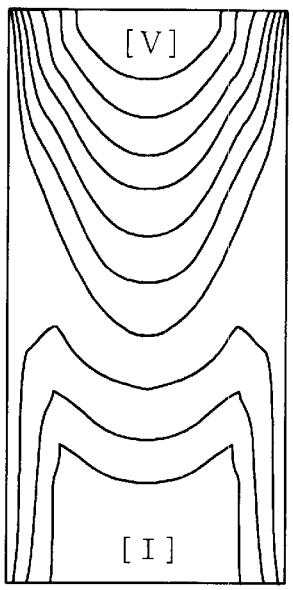
FIG. 6 shows longitudinal sectional views showing the distributions of interstitial silicon atoms and vacancies in each of silicon single crystals according to embodiment 2, comparative example 2 (conventional example), comparative example 3, comparative example 4 and an actual measurement result.
Figure 6:
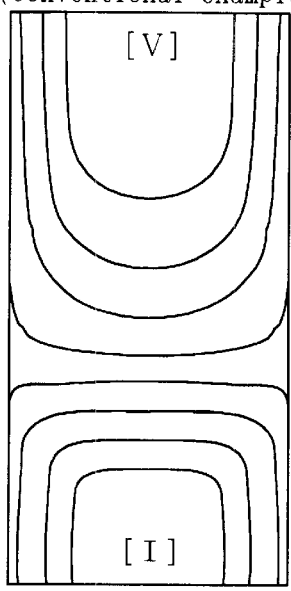
Figure 6:
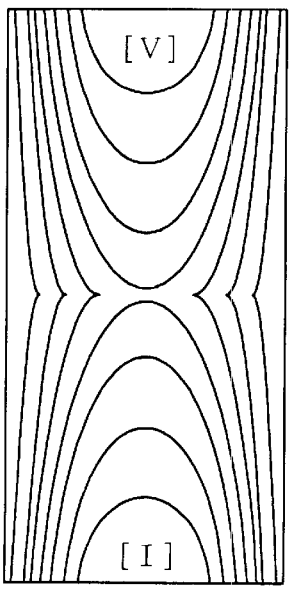
Figure 6:
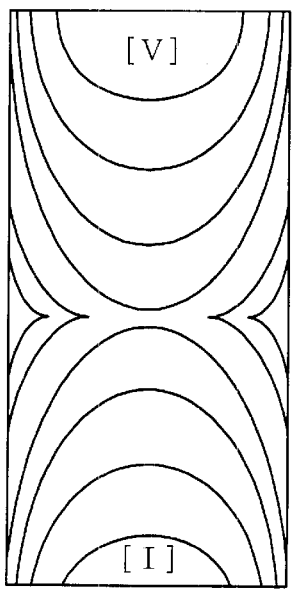
Figure 6:
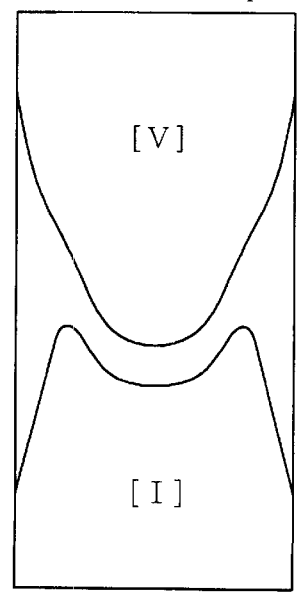

As apparently seen from FIG. 6, it was found that while the distribution of point defects in a silicon single crystal obtained by the simulation method of each of comparative examples 1 to 3 (FIGS. 6(b) to 6(d)) is greatly different from an actual measurement result (FIG. 6(e)), the distribution of point defects in a silicon single crystal obtained by the simulation method of embodiment 1 (FIG. 6(a)) is almost coincident with the actual measurement result.

As described above, since a method according to the present invention inputs physical property values of each member to meshes combined for each member in a hot zone modeled as a mesh structure into a computer, obtains the surface temperature distribution of each member on the basis of the calorific power of a heater and the emissivity of each member, obtains the internal temperature distribution of each member on the basis of the surface temperature distribution and the thermal conductivity of each member, and then further obtains the internal temperature distribution of a molten liquid being in consideration of convection, obtains the shape of the solid-liquid interface between the single crystal and the molten liquid in accordance with an isothermal line including a tri-junction of the single crystal, and repeats the above-mentioned steps until the tri-junction becomes the melting point of the single crystal, and limits meshes of the molten liquid within a specified range, the shape of the solid-liquid interface between the single crystal and the molten liquid obtained by computation coincides very well with an actual measurement result. As the result, the shape of a solid-liquid interface obtained by a simulation method of the present invention can be used as the basis of computation to estimate the distribution of point defects in a silicon single crystal being in consideration of diffusion of them when pulling the silicon single crystal.

And according to a method of obtaining the internal temperature distribution in a single crystal in consideration of convection of a molten liquid and obtaining the distribution of point defects on the basis of this internal temperature distribution in the single crystal and in consideration of diffusion of point defects in the single crystal, the computation result and an actual measurement result of the distribution of point defects in the single crystal coincide very well with each other. As the result, it is possible to estimate the distribution of point defects in a silicon single crystal pulled by a pulling apparatus at the stage of designing the pulling apparatus, and inversely, it is possible to examine the structure of a pulling apparatus at the stage of designing it in order to obtain a desired distribution of point defects in a silicon single crystal pulled.

What is claimed is:

1. A method for simulating the shape of the solid-liquid interface between a single crystal and a molten liquid using a computer, comprising;

a first step of modeling as a mesh structure a hot zone in a pulling apparatus of a single crystal to be computed, a second step of combining meshes for each member in said hot zone and inputting physical property values of said each member corresponding to said combined meshes into the computer, a third step of obtaining the surface temperature distribution of said each member on the basis of the calorific power of a heater and the emissivity of said each member, a fourth step of obtaining the internal temperature distribution of said each member by solving a heat conduction equation on the basis of the surface temperature distribution and the thermal conductivity of said each member, and then further obtaining the internal temperature distribution of a molten liquid being in consideration of convection by simultaneously solving a turbulent model equation obtained on the assumption that the molten liquid is a turbulent flow and Navier-Stokes equation, a fifth step of obtaining the shape of the solid-liquid interface between said single crystal and said molten liquid in accordance with an isothermal line including a tri-junction of said single crystal, and a sixth step of repeating said third to fifth steps until said tri-junction becomes the melting point of said single crystal, wherein;

some or all of the meshes of said molten liquid which are in the radial directions of said single crystal and are directly under said single crystal are set at 0.01 to 5.00 mm, and some or all of the meshes of said molten liquid which are in the longitudinal direction of said single crystal are set to 0.01 to 5.00 mm.

2. A method according to claim 1, wherein;
the physical property values to be given to each member in said second step are the thermal conductivity, emissivity, viscosity, coefficient of thermal expansion, density and specific heat of said each member.

3. A method according to claim 1, wherein;
the turbulent model equation is a kl-model equation represented by the following equation (1), and an optional value within a range of 0.4 to 0.6 is used as the turbulent parameter C of this model equation:

$$\kappa_t = \frac{c}{Pr_t} \times \rho \times C \times d\sqrt{k} \qquad (1)$$

where $\kappa_t$ is the turbulent thermal conductivity of a molten liquid, c is the specific heat of the molten liquid, $Pr_t$ is Prandtl number, $\rho$ is the density of the molten liquid, d is a distance from the inner wall of a crucible containing the molten liquid, and k is the sum square of variable components to the average flow speed of the molten liquid.

4. A method for simulating the distribution of point defects in a single crystal using a computer, comprising;

a first step of modeling as a mesh structure a hot zone in a pulling apparatus of a single crystal in a state in which the single crystal has been pulled to a specified length by the pulling apparatus, a second step of combining meshes for each member of said hot zone, and inputting the physical property values of said each member corresponding to said combined meshes, the pulled length of said single crystal and the pulling speed of said single crystal corresponding to said pulled length into said computer, a third step of obtaining the surface temperature distribution of said each member on the basis of the calorific power of a heater and the emissivity of said each member, a fourth step of obtaining the internal temperature distribution of said each member by solving a heat conduction equation on the basis of the surface temperature distribution and the thermal conductivity of said each member, and then further obtaining the internal temperature distribution of a molten liquid being in consideration of convection by simultaneously solving a turbulent model equation obtained on the assumption that the molten liquid is a turbulent flow and Navier-Stokes equation, a fifth step of obtaining the shape of the solid-liquid interface between said single crystal and said molten liquid in accordance with an isothermal line including a tri-junction of said single crystal, and a sixth step of repeating said third to fifth steps until said tri-junction becomes the melting point of said single crystal, computing the temperature distribution inside said pulling apparatus, obtaining the coordinates and temperatures of the meshes of said single crystal, and providing the respective data into said computer, a seventh step of repeating said first to sixth steps as varying by stages the pulled length of said single crystal, computing the temperature distribution in said pulling apparatus, obtaining the coordinates and temperatures of the meshes of said single crystal, and inputting the respective data into said computer, an eighth step of inputting the coordinates and temperature data of the meshes of said single crystal, and the diffusion coefficients and the boundary conditions of vacancies and interstitial atoms in said single crystal into said computer, and a ninth step of solving a diffusion equation on the basis of the coordinates and temperatures of the meshes of said single crystal and the diffusion coefficients and boundary conditions of said vacancies and said interstitial atoms, and thereby obtaining the density distributions of said vacancies and said interstitial atoms after said single crystal has been cooled.

5. A method to claim 2, wherein;
the turbulent model equation is a kl-model equation represented by the following equation (1), and an optional value within a range of 0.4 to 0.6 is used as the turbulent parameter C of this model equation:

$$\kappa_t = \frac{c}{Pr_t} \times \rho \times C \times d\sqrt{k} \qquad (1)$$

where $\kappa_t$ is the turbulent thermal conductivity of a molten liquid, c is the specific heat of the molten liquid, $Pr_t$ is Prandtl number, $\rho$ is the density of the molten liquid, d is a distance from the inner wall of the crucible containing the molten liquid, and k is the sum square of variable components to the average flow speed of the molten liquid.

* * * * *